United States Patent
Beechem, III et al.

(10) Patent No.: US 11,482,560 B2
(45) Date of Patent: Oct. 25, 2022

(54) TUNABLE INFRARED PIXELS HAVING UNPATTERNED GRAPHENE LAYER AND CONDUCTIVE METASURFACE

(71) Applicant: National Technology & Engineering Solutions of Sandia, LLC, Albuquerque, NM (US)

(72) Inventors: Thomas Edwin Beechem, III, Albuquerque, NM (US); Michael Goldflam, Albuquerque, NM (US); Anna Tauke-Pedretti, Albuquerque, NM (US); Isaac Ruiz, Albuquerque, NM (US); David W. Peters, Albuquerque, NM (US); Stephen W. Howell, Bloomington, IN (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 318 days.

(21) Appl. No.: 16/930,520

(22) Filed: Jul. 16, 2020

(65) Prior Publication Data
US 2020/0350356 A1 Nov. 5, 2020

Related U.S. Application Data

(63) Continuation-in-part of application No. 15/872,293, filed on Jan. 16, 2018, now Pat. No. 10,877,194.
(Continued)

(51) Int. Cl.
*G02B 5/00* (2006.01)
*H01L 27/146* (2006.01)
(Continued)

(52) U.S. Cl.
CPC .. *H01L 27/14652* (2013.01); *H01L 27/14625* (2013.01); *H01L 27/16* (2013.01);
(Continued)

(58) Field of Classification Search
CPC .............. G02B 5/008; G02B 5/20–289; G02F 2203/10; G01N 21/553; G01N 21/554
See application file for complete search history.

(56) References Cited

U.S. PATENT DOCUMENTS

2014/0023321 A1* 1/2014 Lu .................... B82Y 10/00
438/69
2015/0168747 A1 6/2015 Kadono et al.
(Continued)

OTHER PUBLICATIONS

Brar, V.W. et al., "Highly Confined Tunable Mid-Infrared Plasmonics in Graphene Nanoresonators", Nano Lett. (2013), vol. 13, pp. 2541-2547.
(Continued)

*Primary Examiner* — Ryan S Dunning
(74) *Attorney, Agent, or Firm* — Kevin W. Bieg

(57) ABSTRACT

A monolithically integrated, tunable infrared pixel comprises a combined broadband detector and graphene-enabled tunable metasurface filter that operate as a single solid-state device with no moving parts. Functionally, tunability results from the plasmonic properties of graphene that are acutely dependent upon the carrier concentration within the infrared. Voltage induced changes in graphene's carrier concentration can be leveraged to change the metasurface filter's transmission thereby altering the "colors" of light reaching the broadband detector and hence its spectral responsivity. The invention enables spectrally agile infrared detection with independent pixel-to-pixel spectral tunability.

20 Claims, 5 Drawing Sheets

Related U.S. Application Data

(60) Provisional application No. 62/875,820, filed on Jul. 18, 2019.

(51) Int. Cl.

| | | |
|---|---|---|
| *H01L 27/16* | (2006.01) | |
| *H01L 31/0296* | (2006.01) | |
| *H01L 31/0304* | (2006.01) | |
| *H01L 31/0352* | (2006.01) | |
| *H01L 37/02* | (2006.01) | |

(52) U.S. Cl.
CPC .... *H01L 31/02966* (2013.01); *H01L 31/0304* (2013.01); *H01L 31/03046* (2013.01); *H01L 31/035236* (2013.01); *H01L 37/025* (2013.01); *G02B 5/008* (2013.01); *G02F 2203/10* (2013.01); *H01L 27/14669* (2013.01)

(56) References Cited

U.S. PATENT DOCUMENTS

2017/0097451 A1* 4/2017 Kyoung ................. G02B 5/204
2018/0004061 A1  1/2018 Sommer et al.

OTHER PUBLICATIONS

Brar, V.W. et al., "Hybrid Surface-Phonon-Plasmon Polariton Modes in Graphene/Monolayer h-BN Heterostructures", Nano Lett. (2014), vol. 14, pp. 3876-3880.
Chen, J. et al., "Optical nano-imaging of gate-tunable graphene plasmons", Nature, vol. 487 (2012), pp. 77-81.
Fang, Z. et al., "Gated Tunability and Hybridization of Localized Plasmons in Nanostructured Graphene", ACS Nano, vol. 7 (2013), pp. 2388-2395.
Jadidi, M.M. et al., "Tunable Terahertz Hybrid Metal-Graphene Plasmons", Nano Lett., vol. 15 (2015), pp. 7099-7104.
Yao, Y. et al., "Wide Wavelength Tuning of Optical Antennas on Graphene with Nanosecond Response Time", Nano Lett., vol. 14 (2014), pp. 214-219.
Fei, Z. et al., "Gate-Tuning of Graphene Plasmons Revealed by Infrared Nano-Imaging", Nature, vol. 487 (2012), pp. 82-85.
Fei, Z. et al., "Edge and Surface Plasmons in Graphene Nanoribbons" Nano Lett., vol. 15 (2015), pp. 8271-8276.
Woessner, A. et al., "Highly Confined Low-Loss Plasmons in Graphene-Boron Nitride Heterostructures", Nature Materials, vol. 14 (2015), pp. 421-425.
Goldflam, M.D. et al., "Tuning and Persistent Switching of Graphene Plasmons on a Ferroelectric Substrate", Nano Lett., vol. 15 (2015), pp. 4859-4864.
Jablan, M. et al., "Plasmonics in Graphene at Infrared Frequencies", Physical Review B, vol. 80 (2009), 245435, p. 245435-1-245435-7.
Goldflam, M.D. et al., "Designing Graphene Absorption in a Multispectral Plasmon-Enhanced Infrared Detector", Optics Express, vol. 25 (2017), pp. 12400-12408.
Olson, B.V. et al., "Auger Recombination in Long-Wave Infrared InAs/InAsSb type-II Superlattices", Applied Physics Letters, vol. 107 (2015), 261104, pp. 261104-1-261104-4.
Aytac, Y. et al., "Effects of layer thickness and alloy composition on carrier lifetimes in mid-wave Infrared InAs/InAsSt Superlattices", Applied Physics Letters, vol. 105 (2014), 022107, pp. 022107-1-022107-4.
Dyer, G.C. et al., "Far Infrared Edge Photoresponse and Persistent Edge Transport in an Inverted InAs/GaSb Heterostructure", Applied Physics Letters, vol. 108 (2016), 013106, pp. 013106-1-013106-5.
Goldflam, M.D. et al. "Enhanced Infrared Detectors Using Resonant Structures Combined with Thin Type-II Superlattice Absorbers", Applied Physics Letters, vol. 109 (2016), 251103, pp. 251103-1-251103-5.
Ting, D.Z. et al., "Mid-Wavelength High Operating Temperature Barrier Infrared Detector and Focal Plane Array", Applied Physics Letters, vol. 113 (2018), 021101, pp. 021101-1-021101-4.
Rhiger, D.R. "Performance Comparison of Long-Wavelength Infrared Type II Superlattice Devices with HgCdTe", Journal of Electronic Materials, vol. 40 (2011), pp. 1815-1822.
Goldman, M.D. et al., "Monolithically fabricated tunable long-wave infrared detectors based on dynamic graphene metasurfaces", Applied Physics Letters, vol. 116 (2020), 191102, pp. 191102-1-191102-5.

* cited by examiner

TUNABLE INFRARED PIXELS HAVING UNPATTERNED GRAPHENE LAYER AND CONDUCTIVE METASURFACE

CROSS-REFERENCE TO RELATED APPLICATIONS

This application is a continuation-in-part of U.S. application Ser. No. 15/872,293, filed Jan. 16, 2018, which is incorporated herein by reference. This application claims the benefit of U.S. Provisional Application No. 62/875,820, filed Jul. 18, 2019, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to infrared sensors and, in particular, to tunable infrared pixels via dynamic metasurfaces.

BACKGROUND OF THE INVENTION

Infrared (IR) sensors image scenes that are spatially, spectrally, and temporally dynamic even as the pixels themselves are comparatively inflexible. These pixels are typically composed of complex semiconductors like HgCdTe (MCT) and InGaAs that are utilized both as a consequence of their bandgap being commensurate with IR wavelengths and the ability to vary this gap over a spectral range based upon the material's composition. Such tunability is realized, however, only during design as composition, and hence spectral responsivity, is fixed upon fabrication.

For this reason, dynamic, real-time tunability has been achieved only by external means through the use of filter wheels, tunable filters, or interferometry. See C. D. Tran, *Appl. Spectrosc. Rev.* 38(2), 133 (2003). These solutions fundamentally lack for two reasons. First, the external filters are decoupled from the detector and thus require both alignment and an increase in the size of the optical set-up. Second, each of these approaches filters the light uniformly over the entire array. It is thus impossible to assess differing portions of a scene simultaneously with separate spectral bands. Overcoming these constraints necessitates a pixel that is itself as dynamic as the scene it is tasked to image.

Tunable pixels can be realized using two broad approaches. First, the detector can be constructed out of materials whose optical properties can be controllably varied. Bilayer graphene and InAs quantum dots have each been used to this end but have yet to achieve responsivities comparable to more traditional architectures. See J. Yan et al., *Nat. Nanotechnol.* 7(7), 472 (2012); and U. Sakoglu et al., *J. Opt. Soc. Am.* B 21(1), 7 (2004). Alternatively, a broadband detector can be placed "behind" a tunable filter that is registered at the single pixel level.

Tunable infrared filters have recently emerged as an increasingly common technology all their own. Devices have been demonstrated leveraging phenomena ranging from phase change and mechanical movement to plasmonic excitation. See P. Li et al., *Nat. Mater.* 15, 870 (2016); N. I. Zheludev and E. Plum, *Nat. Nanotechnol.* 11(1), 16 (2016); and Y. Yao et al., *Nano Lett.* 14(1), 214 (2013). Regardless of phenomena, tunable filters operate by attempting to maximize field concentration within a material whose optical properties are controllably varied. This is most often achieved using patterned metasurfaces that functionally act to enhance the field within the tunable material. The tunable material, meanwhile, is actuated with an electrical bias to either change shape (SiN), phase (e.g., via Joule-heating in GeSbTe (GST), $VO_2$), or the free carrier concentration (ITO, graphene). These tuning approaches naturally offer trade-offs. Electromechanical and phase change produce larger tuning ranges than altering the carrier concentration. Changing shape requires moving parts, however. Phase change requires Joule-heating, which limits the effectiveness of the cooled detector sitting behind it.

In contrast, modulating charge carriers with an electrical bias, according to the present invention, minimally dissipates power and is extremely fast. Furthermore, being the basis of semiconductor technology, this approach provides an architecture whose integration atop an imaging array can be straightforward.

SUMMARY OF THE INVENTION

The present invention is directed to a monolithically integrated, tunable infrared pixel comprising an infrared detector; a bottom dielectric layer disposed on the infrared detector; an unpatterned graphene layer on the bottom dielectric layer; a top dielectric layer on the unpatterned graphene layer; and a conductive metasurface on the top dielectric layer, wherein the metasurface is patterned to excite plasmons within the unpatterned graphene layer and wherein the metasurface is adapted to apply a voltage bias to the unpatterned graphene layer, thereby changing the Fermi level of the graphene and tuning the resonance response of the pixel to incident infrared light.

The combined detector and filter operate as a single solid-state device with no moving parts whose alignment is implicit with fabrication. Functionally, tunability results from the plasmonic properties of graphene that are acutely dependent upon the carrier concentration within the infrared. Voltage induced changes in graphene's carrier concentration can thus be leveraged to change the metasurface filter's transmission thereby altering the "colors" of light reaching the broadband detector and hence its spectral responsivity. Therefore, the invention enables spectrally agile infrared detection with independent pixel-to-pixel spectral tunability.

As an example of the invention, a tunable infrared pixel comprising a type-II superlattice detector was fabricated that was monolithically integrated with a graphene-enabled tunable metasurface filter. The spectral responsivity of the detector at varying levels of bias across the graphene was measured. Relative changes in excess of 20% were observed as a result of spectral shifts in the filter of nearly 50 $cm^{-1}$ at ~1000 $cm^{-1}$.

BRIEF DESCRIPTION OF THE DRAWINGS

The detailed description will refer to the following drawings, wherein like elements are referred to by like numbers.

DETAILED DESCRIPTION OF THE INVENTION

Figure 1:
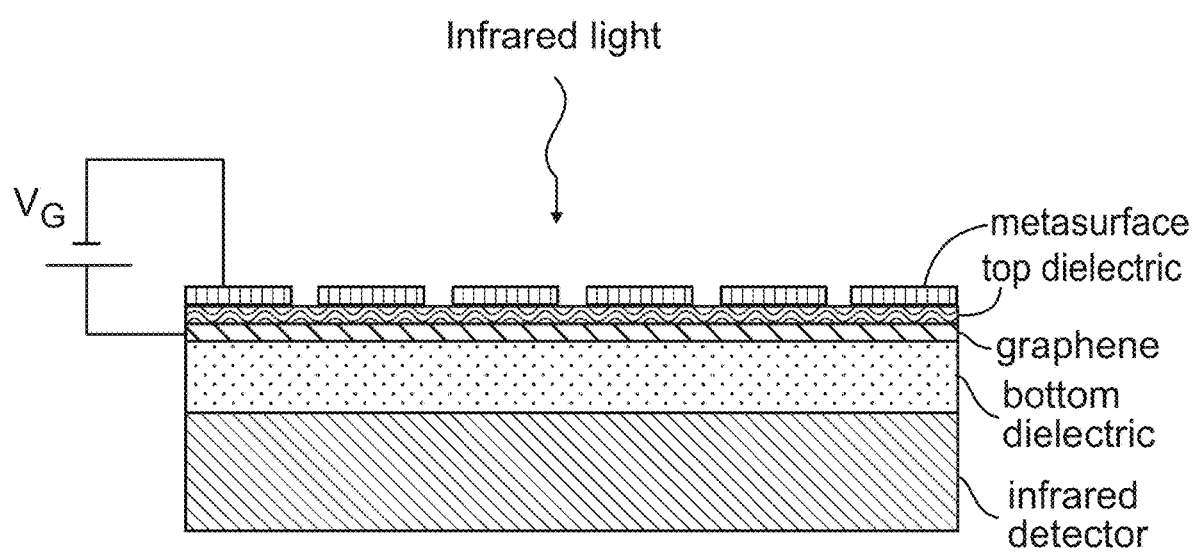
FIG. 1 is a schematic side-view illustration of a monolithically integrated tunable infrared pixel (TIP) showing the various layers and the incident infrared beam. Unpatterned graphene is sandwiched between two dielectric layers.

An end-view schematic illustration of a tunable infrared pixel (TIP) comprising several layers of the monolithically integrated pixel structure is shown in FIG. 1. Depending on the details of the structure, the TIP can generally be responsive to infrared light from about 1 to 60 microns wavelength and, more preferably, to long wavelength infrared (LWIR) light (e.g., 6 to 18 microns wavelength). The filter layers can be built directly on an infrared detector comprising a sensing element or photodetector. The TIP structure further comprises a continuous, unpatterned graphene layer sandwiched between two dielectric layers on the infrared detector. Finally, a patterned metasurface structure is deposited on the top dielectric layer.

Graphene is chosen for two reasons. First, it has been used in numerous "stand-alone" tunable infrared filters reported previously. See Y. Yao et al., *Nano Lett.* 14(1), 214 (2013); and U.S. application Ser. No. 15/872,293, filed Jan. 16, 2018, which is incorporated herein by reference. Second, being a two-dimensional van der Waals solid, graphene can be transferred at room temperature directly atop the detector material while imparting virtually no mechanical load to the underlying detector. Tunability of the TIP arises from excitation of plasmons within the unpatterned graphene layer. While graphene is only one atom thick, its interaction with infrared light can be enhanced by plasmonic excitation enabling graphene to significantly influence the optical response of the TIP. Importantly, the plasmonic dispersion of graphene is determined by both its surrounding dielectric environment, as well as graphene's free carrier density. Changes to the Fermi level cause shifts in the plasmon dispersion, thereby modifying the excitation energies of plasmons at a given momentum. See Z. Fei et al., *Nature* 487, 82 (2012); Z. Fei et al., *Nano Lett.* 15, 8271 (2015); A. Woessner et al., *Nat. Mater.* 14, 421 (2015); M. D. Goldflam et al., *Nano Lett.* 15, 4859 (2015); and M. Jablan et al., *Phys. Rev. B* 80, 245435 (2009).

The sandwich comprises a thick bottom dielectric layer on an infrared detector, the unpatterned graphene layer, and a thin top dielectric layer deposited on the graphene layer. The choice of surrounding dielectrics, and the geometry itself, have a strong influence on the regions of tunability enabling pixels to be designed for functionality in specific wavelength regimes. The dielectric layers serve two purposes. First, they electrically separate the detector element and conductive nanoantenna from the graphene. Second, these dielectrics serve to define the spectral location of the graphene tunability, its magnitude, and the shape of the pass band. A variety of non-conductive dielectric materials can be used for the dielectric layers, such as hafnium dioxide, alumina, magnesium oxide, lead zirconium titanate, or silicon dioxide. The top dielectric layer preferably provides an efficient high-κ gate dielectric (e.g., κ greater than 10) that is also thin enough for Fermi level modification when a bias voltage is applied between the metasurface and the graphene. The top dielectric layer further provides a spacer layer to prevent contact between graphene and the conductive metasurface which would cause Fermi level pinning of the graphene and limit spectral tunability. The presence of the capping top dielectric also helps to ensure the long term stability of the underlying graphene by isolating it from the environment, thereby preventing accumulation of adsorbates on the graphene over time. See J. D. Fowler et al., *ACS Nano* 3, 301 (2009); and C. W. Chen et al., *J. Vac. Sci. Technol. B* 30, 040602 (2012). Typically, the top dielectric can range in thickness from 1-100 nm to facilitate biasing of the graphene whereas the bottom dielectric can range in thickness from 50-1000 nm to ensure electrical isolation of the detector from the graphene filter.

Next, a metasurface structure is deposited on the top dielectric layer. The metasurface serves multiple purposes: first, it can act as a top gate for graphene allowing the high-κ dielectric nature of the top dielectric layer to be employed for injection of charge into the graphene; second, field enhancement within the small gaps of the metasurface results in increased interaction of incident light with the continuous graphene sheet; and lastly, the resonant response of the metasurface itself excites graphene plasmons that can dominate the overall response of the pixel filter. The metasurface can comprise any conductive material and pattern that is capable of exciting plasmons in the underlying unpatterned graphene layer. The metasurface can be adapted to apply a voltage bias, $V_G$, to the graphene layer, thereby changing the Fermi level of the graphene and tuning the resonance response of the pixel to the incident infrared light. For example, the metasurface can comprise a grating with periodicity comparable to the wavelength of the incident infrared light and, more preferably, subwavelength to the incident light. For example, the grating metasurface can comprise a thin gold grating patterned over the graphene pixel area. Other metals or conductive non-metals, such as conductive oxides and polymers, can also be used for the metasurface material.

The finished pixel provides a tunable filter that is fully integrated to the infrared detector as a single solid-state device. Therefore, the invention enables independent spectral tuning of individual pixels across an array. Detecting arrays can comprise thousands of separate pixels arranged in a grid, wherein each pixel typically has a size ranging from ten to hundreds of microns. The invention thus allows each pixel to have its spectral response separately tuned via the addition of a single filter contact applied at each pixel beyond those used to operate the infrared detector.

As an example of the invention, tunable graphene filters were fabricated directly atop a gallium-free type-II superlattice (T2SL) infrared detector with a cut-off wavelength of 11 μm. Spectral responsivity of the TIP was measured as a function of electrostatic gating of the graphene filter. Dynamic and continuous tuning of the relative spectral responsivity resulted in changes of >20%. These changes were then leveraged to dynamically alter the comparative sensitivity between two spectrally separated infrared absorption bands of polypropylene to emphasize the device's "push-button" tunability.

Figure 2A:
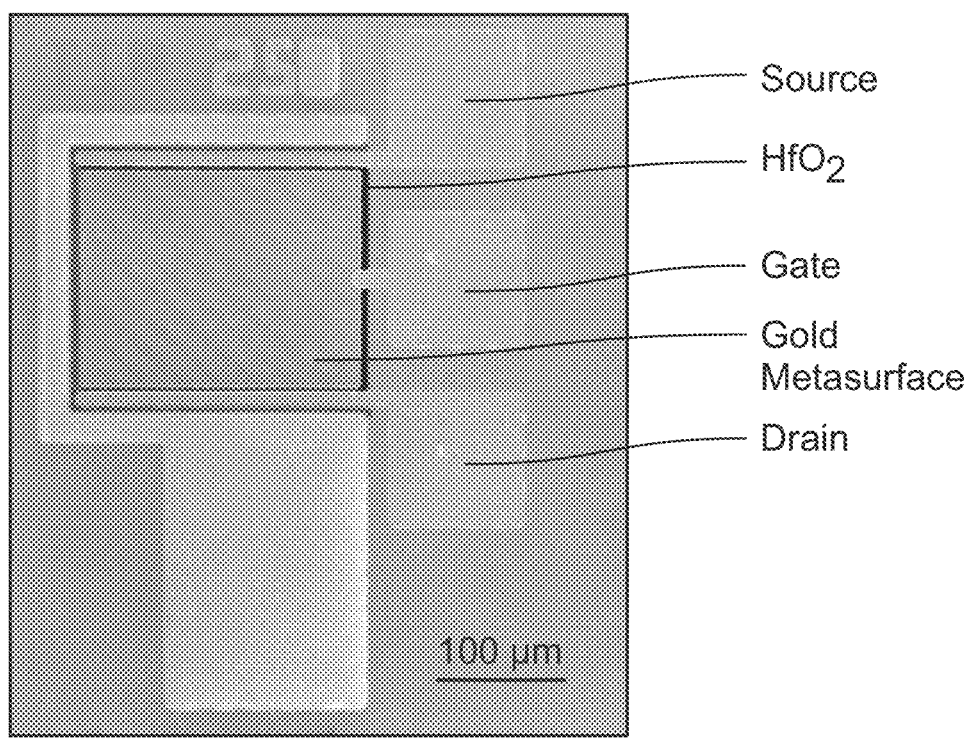
FIG. 2A is a top-view false color micrograph of a TIP.
Figure 2B:
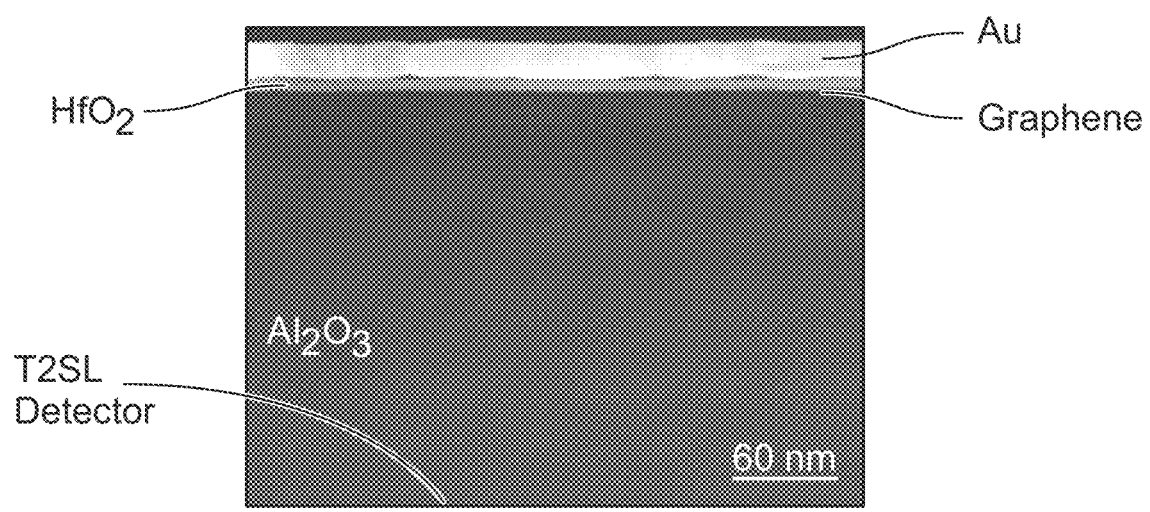
FIG. 2B is a cross-sectional view of the pixel comprising a gold grating sitting atop a thin $HfO_2$ dielectric and graphene stack.

The fabricated exemplary TIP is shown in FIGS. 2A and 2B from both a plan and cross-sectional view. The TIP has a pixel area of approximately 250×250 µm². Beginning from the top, the filter comprises an Au grating metasurface that excites the graphene plasmon. In this example, the 50 nm thick gold grating has a period of 1 µm and a gap between the grating electrodes of 100 nm. The graphene plasmon's energy, and hence the pass-band of the filter, is controlled dynamically by placing a voltage using the Au grating across a 20-nm thick $HfO_2$ layer (κ~25) that rests above the graphene. The voltage electrostatically dopes the graphene inducing changes in the material's optical properties and thus its plasmonic response. A 500-nm thick $Al_2O_3$ bottom dielectric layer supports the graphene and practically serves as a "coarse knob" for dictating the static spectral character of the filter. See M. D. Goldflam et al., *Opt. Express* 25(11), 12400 (2017). Each of these layers is fabricated atop the detector through layer transfer techniques (e.g., of chemical vapor deposition-grown (CVD) graphene), atomic layer deposition (ALD), and/or standard lithography approaches. Such processing does not appreciably change the detector properties. See X. Li et al., *Science* 324(5932), 1312 (2009); and Y. Hernandez et al., Nat. Nanotechnol. 3(9), 563 (2008).

The detector can comprise a T2SL long-wave infrared (LWIR) absorber synthesized atop a GaSb substrate. Use of a T2SL detector is motivated by theoretical predictions of dark current characteristics surpassing that of mercury-cadmium-telluride (MCT). See B. Olson et al., *Appl. Phys. Lett.* 107(26), 261104 (2015); Y. Aytac et al., *Appl. Phys. Lett.* 105(2), 022107 (2014); G. Dyer et al., *Appl. Phys. Lett.* 108(1), 013106 (2016); M. D. Goldflam et al., *Appl. Phys. Lett.* 109(25), 251103 (2016); and D. Z. Ting et al., *Appl. Phys. Lett.* 113, 021101 (2018). However, the tunable architecture of the present invention can easily be applied atop a conventional MCT photodetector which can provide a significant increase in quantum efficiency over that of the T2SL detector. For the present case, quantum efficiency of the T2SL detector is hindered by the low absorption coefficient of the 2 µm thick superlattice in the LWIR wavelength range. See M. D. Goldflam et al., *Appl. Phys. Lett.* 109(25), 251103 (2016); and D. R. Rhiger, *J. Electron. Mater.* 40(8), 1815 (2011). Depending on the wavelength range and operating characteristics of interest, other compound semiconductor infrared photodetectors can also be used, such as InAs, InSb, or InGaAs as well as pyroelectric and bolometric detectors composed of deuterated triglycine sulfate (DTGS) or lead zirconate titanate (PZT). See E. L. Dereniak and G. D. Boreman, *Infrared Detectors and Systems*, Wiley (1996).

The exemplary tunable integrated pixel was characterized initially via measurements of its spectral responsivity. These measurements were carried out by focusing light output from a Fourier transform infrared spectrometer (FTIR) onto the TIP. The electrical output of the detector was then fed directly back into the FTIR such that the response from 8-12 µm (800-1200 $cm^{-1}$) could be assessed continuously as a function of filter bias. Spectral characteristics of the FTIR light-source were calibrated using a commercial deuterated triglycine sulfate (DTGS) detector. See O. Gravrand et al., "A calibration method for the measurement of IR detector spectral responses using a FTIR spectrometer equipped with a DTGS reference cell," in *High Energy, Optical, and Infrared Detectors for Astronomy VI*, vol. 9154. International Society for Optics and Photonics, Conference Proceedings, p. 91542O (2014).

Figure 3A:
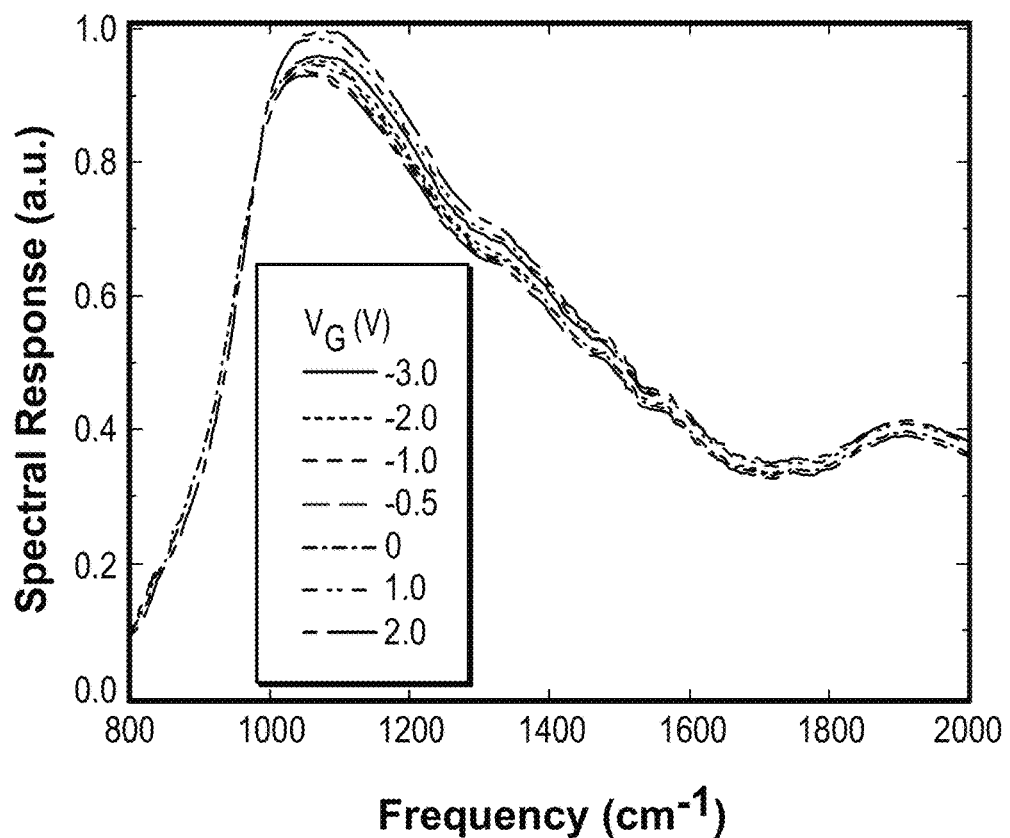
FIG. 3A is a graph of the spectral photoresponse of an exemplary TIP at varying gate voltages used to control the spectral response of filter.
Figure 3B:
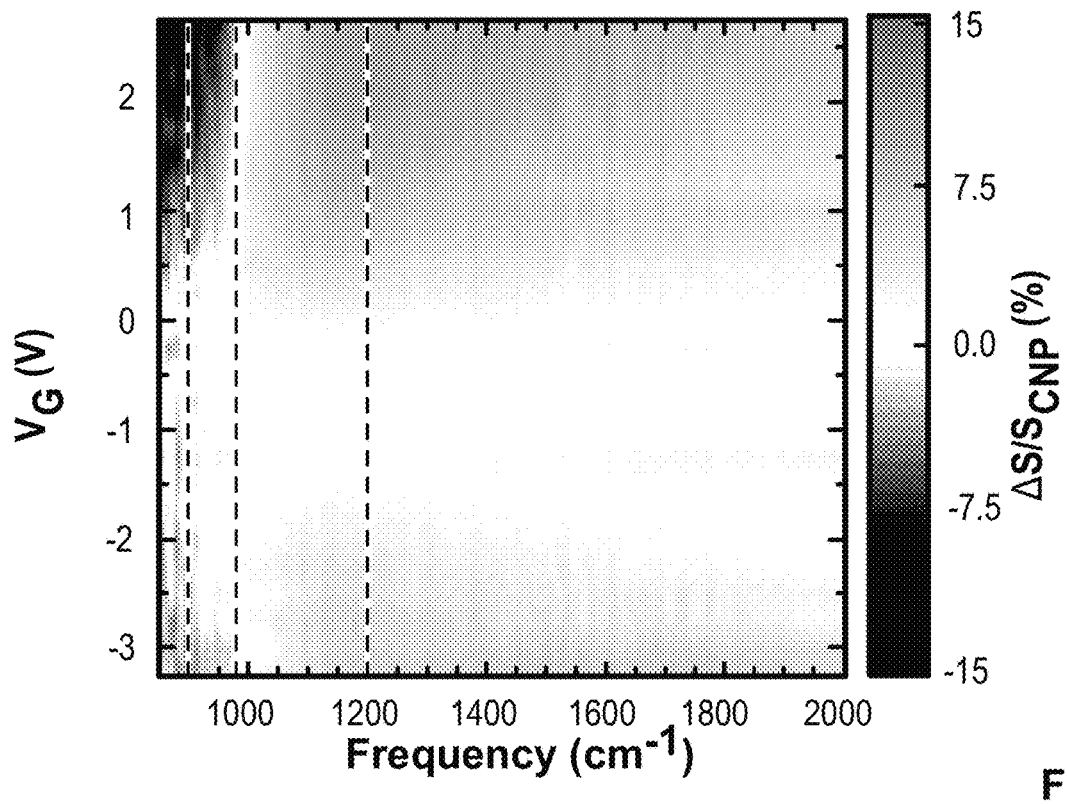
FIG. 3B is a map of spectral responsivity as a function of wavelength and gate voltage. Plots in FIG. 3A are horizontal line cuts of FIG. 3B.
Figure 3C:
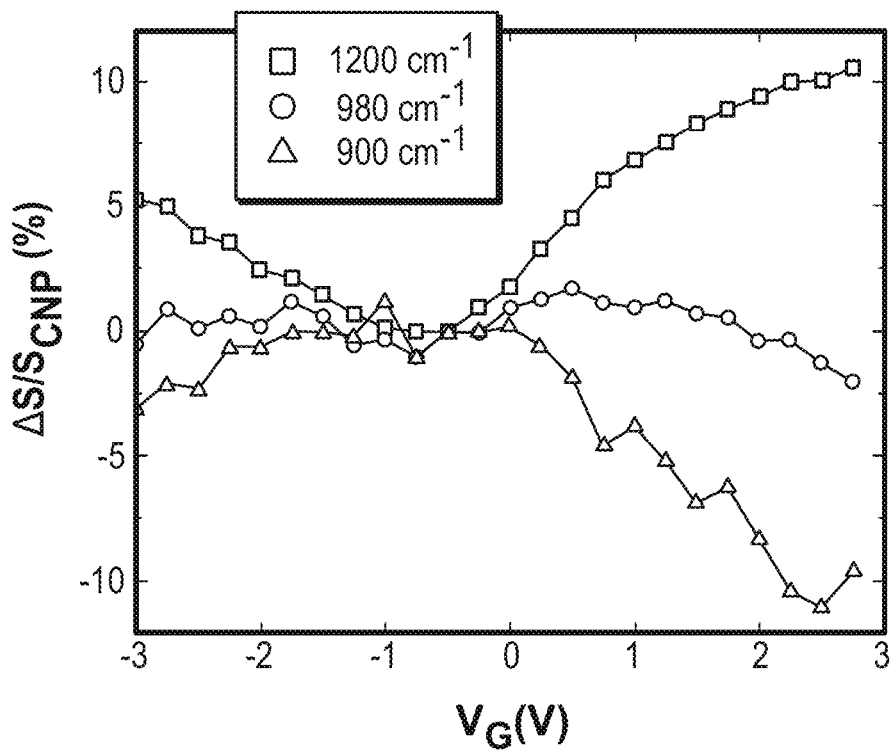
FIG. 3C is a graph of spectral responsivity at 900 $cm^{-1}$, 980 $cm^{-1}$, and 1200 $cm^{-1}$ (i.e., the vertical dashed lines in FIG. 3B as a function of gate voltage).

Spectral tuning of the device was apparent, repeatable, and continuous, as shown in FIGS. 3A-3C. FIG. 3A is a graph of the spectral photoresponse of TIP device at varying gate voltages. Quantitatively, the detector's relative response changes by nearly ±20% relative to that at the charge neutrality point (CNP) of the graphene by varying the gate voltage from 2 to −3 V. FIG. 3B is a map of spectral responsivity as a function of wavelength and gate voltage. FIG. 3C is a graph of spectral responsivity at 900 $cm^{-1}$, 980 $cm^{-1}$, and 1200 $cm^{-1}$ as a function of gate voltage. The location of maximum responsivity varies by 50 $cm^{-1}$. The changes are analog allowing for continuous tuning as opposed to the digital states typically available when filtering with phase change materials.

Figure 4:
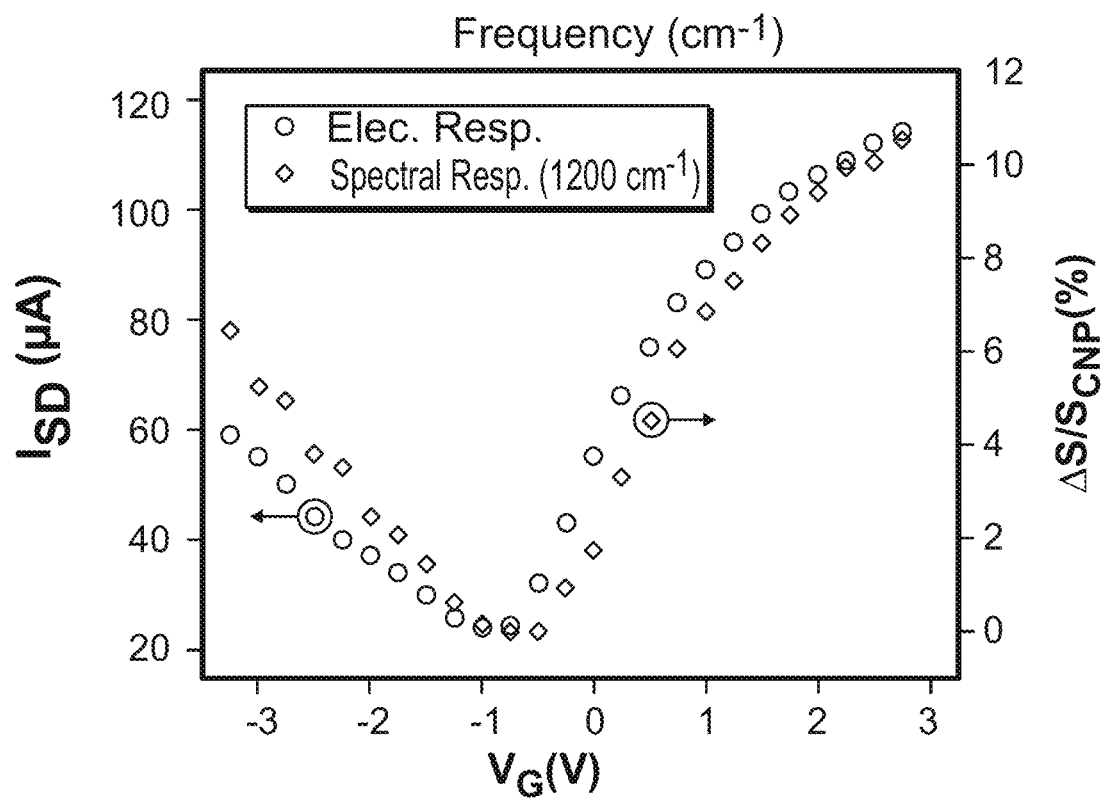
FIG. 4 is a comparison of electrical transport with the graphene filter and the TIP spectral responsivity at 1200 $cm^{-1}$.

Variations in the spectral response are caused by changes in the amount of transmitted light through the filter rather than a spurious alteration in the detector's charge transport induced by the electrostatic gating of the graphene. This is evidenced by comparing the current-voltage characteristics of the graphene with the spectral response of the detector at 1200 $cm^{-1}$, as shown in FIG. 4. The graphene current correlates to changes in the spectral response of the graphene. Specifically, changes in spectral responsivity of the TIP device as a whole qualitatively match the amount of current moving through the graphene. This correlation, in combination with changes observed in the device's reflectance as a function of gate voltage (not shown), indicates that the graphene/dielectric stack is operating as a tunable light filter. The filter operates electrostatically with minimal dissipation of current. The filter dissipates only the current "leaking" through the gate, which is orders of magnitude less than that moving through the detector itself. The TIP device therefore provides additional functionality with minimal additional power consumption.

Figure 5A:
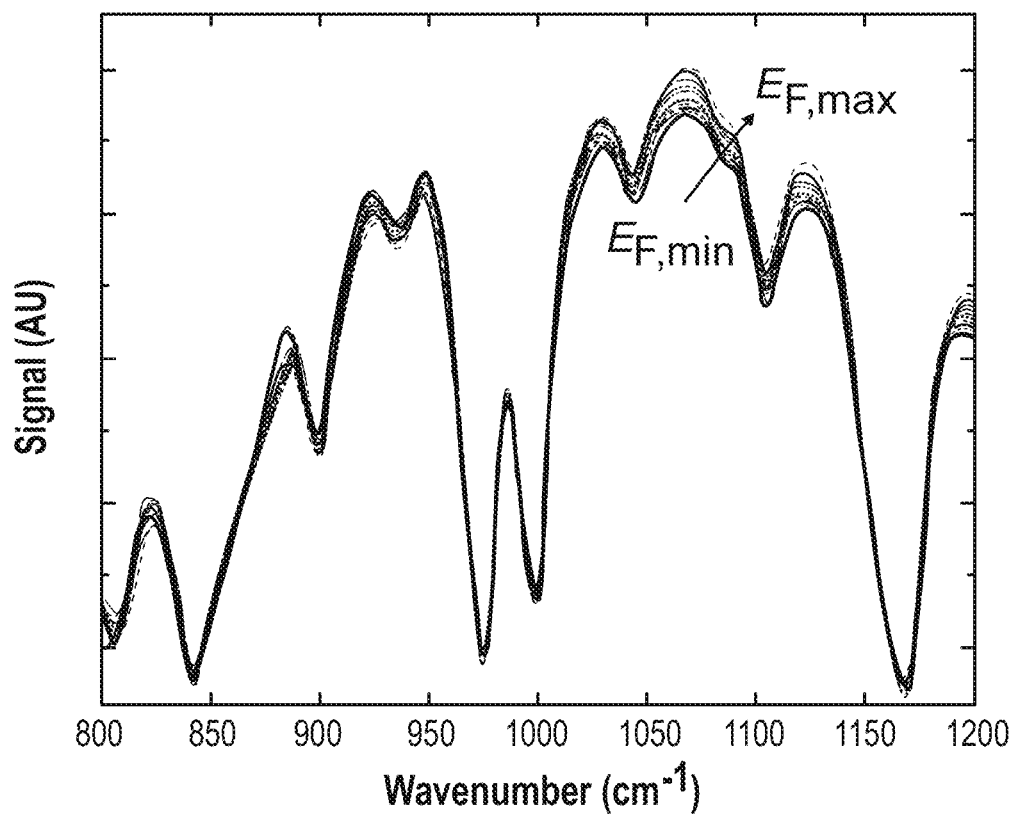
FIG. 5A is a graph of the measured spectra of polypropylene from the TIP-device as the Fermi-level ($E_F$) of the graphene is changed via the gate voltage.
Figure 5B:
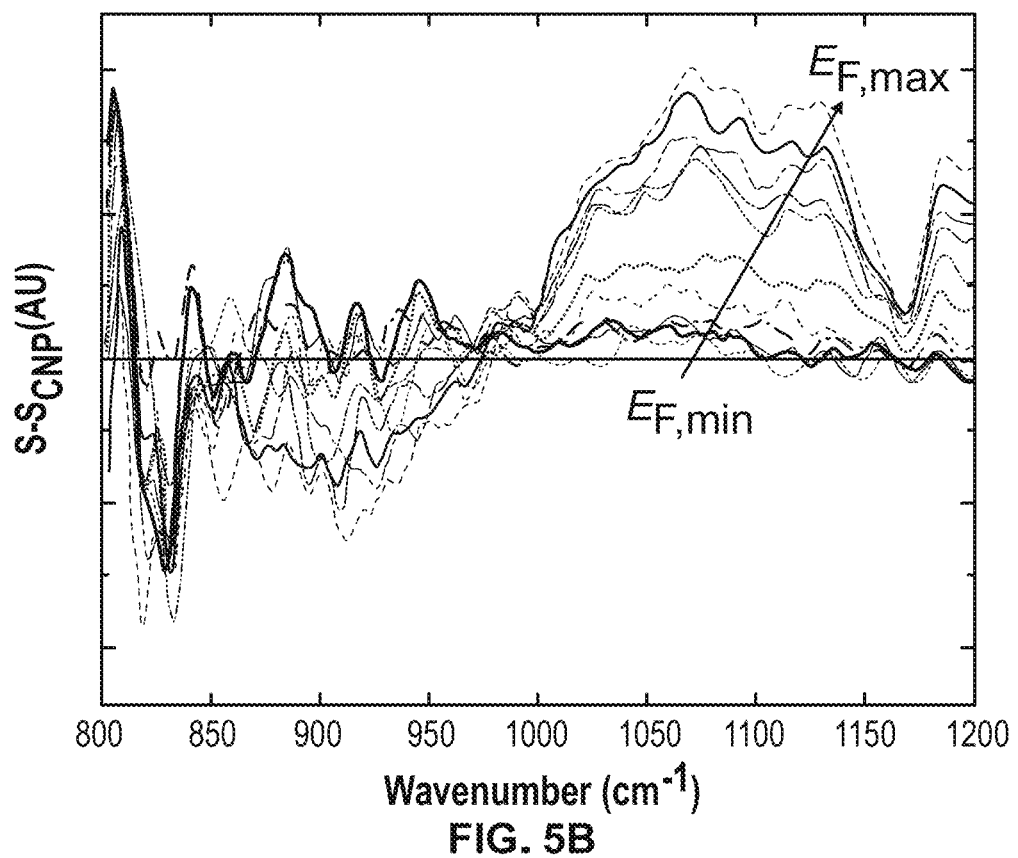
FIG. 5B is a graph of the difference spectra.

The tunability of the graphene filter allows for "push-button" control of a pixel's spectral sensitivity. To demonstrate this, a thin polypropylene film was placed between the light source and the TIP device. The infrared spectrum measured by the TIP pixel was then acquired with the graphene set at several different Fermi-levels ($E_F$) as controlled by the gate voltage. Results are shown in FIG. 5A where changes in the response, and hence sensitivity, to certain modes are appreciably varied. This is exemplified by comparing the signals near 930 and 1100 $cm^{-1}$. For the lower energy mode, maximum sensitivity (i.e., largest "dip" in signal) is observed when the graphene Fermi-level is maximized—i.e., the optical conductivity of graphene is greatest. The opposite is true for the mode near 1100 $cm^{-1}$ leading to difference spectra that "flip" in the magnitude of their signal near 1000 $cm^{-1}$, as shown in FIG. 5B. Effectively, the device is more sensitive to one mode as it becomes less sensitive to another. This spectral selectivity is typically acquired through the use of stand-alone filters. Here, spectral sensitivity is shown to be integral to the TIP itself.

By fabricating a dynamic graphene metasurface structure atop a T2SL infrared detector, tunable spectral responsivity at the single pixel level can be obtained in the LWIR. The monolithic approach increases functionality while maintaining the standard lamellar architecture of semiconductor devices without appreciably increasing the size or power consumption of the detector. The invention enables imaging arrays comprising pixels with independent and controllable spectral responsivities.

The present invention has been described as tunable infrared pixels via dynamic metasurfaces. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A tunable infrared pixel, comprising:
   an infrared detector;
   a bottom dielectric layer disposed on the infrared detector;
   an unpatterned graphene layer on the bottom dielectric layer;
   a top dielectric layer on the unpatterned graphene layer; and
   a conductive metasurface on the top dielectric layer, wherein the metasurface is patterned to excite plasmons within the unpatterned graphene layer and wherein the metasurface is adapted to apply a voltage bias to the unpatterned graphene layer, thereby changing the Fermi level of the graphene and tuning the resonance response of the pixel to incident infrared light.

2. The tunable infrared pixel of claim 1, wherein the infrared detector comprises a gallium-free type-II superlattice detector.

3. The tunable infrared pixel of claim 1, wherein the infrared detector comprises a compound semiconductor.

4. The tunable infrared pixel of claim 3, wherein the compound semiconductor comprises HgCdTe, InAs, InSb, or InGaAs.

5. The tunable infrared pixel of claim 1, wherein the infrared detector comprises a pyroelectric or bolometric detector.

6. The tunable infrared pixel of claim 5, wherein the pyroelectric or bolometric detector comprises deuterated triglycine sulfate or lead zirconate titanate.

7. The tunable infrared pixel of claim 1, wherein the bottom dielectric layer comprises alumina.

8. The tunable infrared pixel of claim 1, wherein the bottom dielectric layer comprises hafnium dioxide, magnesium oxide, lead zirconium titanate, or silicon dioxide, barium fluoride, silicon carbide, aluminum nitride or other polar dielectrics.

9. The tunable infrared pixel of claim 1, wherein the bottom dielectric layer has a thickness of between 50 and 1000 nm.

10. The tunable infrared pixel of claim 1, wherein the top dielectric layer comprises a high-κ gate dielectric.

11. The tunable infrared pixel of claim 10, wherein κ is greater than 10.

12. The tunable infrared pixel of claim 1, wherein the top dielectic layer comprises hafnium dioxide.

13. The tunable infrared pixel of claim 1, wherein the top dielectric layer comprises hexagonal boron nitride, silicon dioxide, magnesium oxide, lead zirconium titanate, or alumina.

14. The tunable infrared pixel of claim 1, wherein the metasurface comprises a conductive grating.

15. The tunable infrared pixel of claim 1, wherein the metasurface comprises a metal.

16. The tunable infrared pixel of claim 1, wherein the metasurface comprises a conductive oxide, conductive polymer, or other conductive non-metal.

17. The tunable infrared pixel of claim 1, wherein the metasurface pattern has a periodicity that is subwavelength to the incident infrared light.

18. The tunable infrared pixel of claim 1, wherein the wavelength of the incident infrared light is between 1 microns and 60 microns.

19. The tunable infrared pixel of claim 18, wherein the wavelength of the incident infrared light is between 6 and 18 microns.

20. The tunable infrared pixel of claim 1, further comprising at least one additional tunable infrared pixel to provide an array of detecting pixels.

* * * * *